United States Patent
Cohen

(10) Patent No.: US 8,531,241 B1
(45) Date of Patent: Sep. 10, 2013

(54) SYSTEM AND METHOD FOR PROCESS, VOLTAGE, TEMPERATURE (PVT) STABLE DIFFERENTIAL AMPLIFIER TRANSFER FUNCTION

(75) Inventor: Hanan Cohen, San Diego, CA (US)

(73) Assignee: Applied Micro Circuits Corporation, Sunnyvale, CA (US)

(*) Notice: Subject to any disclaimer, the term of this patent is extended or adjusted under 35 U.S.C. 154(b) by 205 days.

(21) Appl. No.: 13/014,567

(22) Filed: Jan. 26, 2011

(51) Int. Cl.
*H03F 3/45* (2006.01)

(52) U.S. Cl.
USPC .......................... 330/253; 330/254; 330/302

(58) Field of Classification Search
USPC ........................................ 330/253, 302, 254
See application file for complete search history.

(56) References Cited

U.S. PATENT DOCUMENTS

| | | | |
|---|---|---|---|
| 6,882,226 B2 * | 4/2005 | Cho et al. | 330/282 |
| 6,897,712 B2 * | 5/2005 | Ficken et al. | 327/537 |
| 7,777,526 B2 * | 8/2010 | Shumarayev et al. | 326/83 |
| 8,135,100 B2 * | 3/2012 | Beukema et al. | 375/350 |
| 2002/0118056 A1 | 8/2002 | Helt et al. | |
| 2003/0139164 A1 | 7/2003 | Salcido et al. | |
| 2003/0184459 A1 | 10/2003 | Engl | |
| 2004/0251965 A1 | 12/2004 | Ueda et al. | |
| 2005/0248389 A1 | 11/2005 | Nguyen | |
| 2006/0208818 A1 * | 9/2006 | Lee et al. | 331/167 |
| 2007/0132522 A1 * | 6/2007 | Lee et al. | 331/167 |
| 2010/0176869 A1 | 7/2010 | Horie et al. | |
| 2010/0289585 A1 | 11/2010 | Tomisawa et al. | |
| 2010/0308912 A1 | 12/2010 | Siegel | |
| 2010/0308918 A1 | 12/2010 | Gomez et al. | |
| 2010/0315164 A1 | 12/2010 | Vakilian | |

* cited by examiner

*Primary Examiner* — Patricia Nguyen

(57) ABSTRACT

A method is provided for process, voltage, temperature (PVT) stable transfer function calibration in a differential amplifier. The gain resistors of a differential amplifier are initially selected to achieve a flat amplitude transfer function in the first frequency band. After calibration, the degeneration capacitor is connected and tuned until a peaked amplitude transfer function is measured, which is resistant to variations in PVT. As an alternative, the degeneration capacitor is not disconnected during initial calibration. Then, the gain resistors and the degeneration capacitor values are selectively adjusted until the first peaked amplitude transfer function is obtained. The peaked amplitude transfer function remains even more stable to variations in PVT than the flat amplitude calibration method.

15 Claims, 8 Drawing Sheets

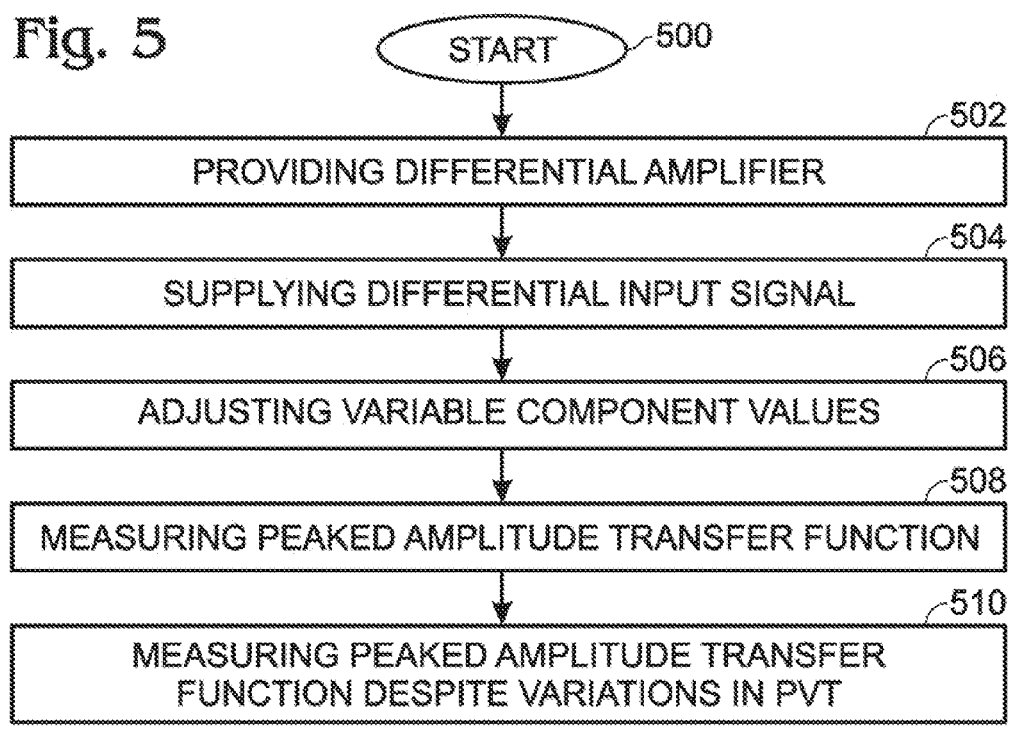

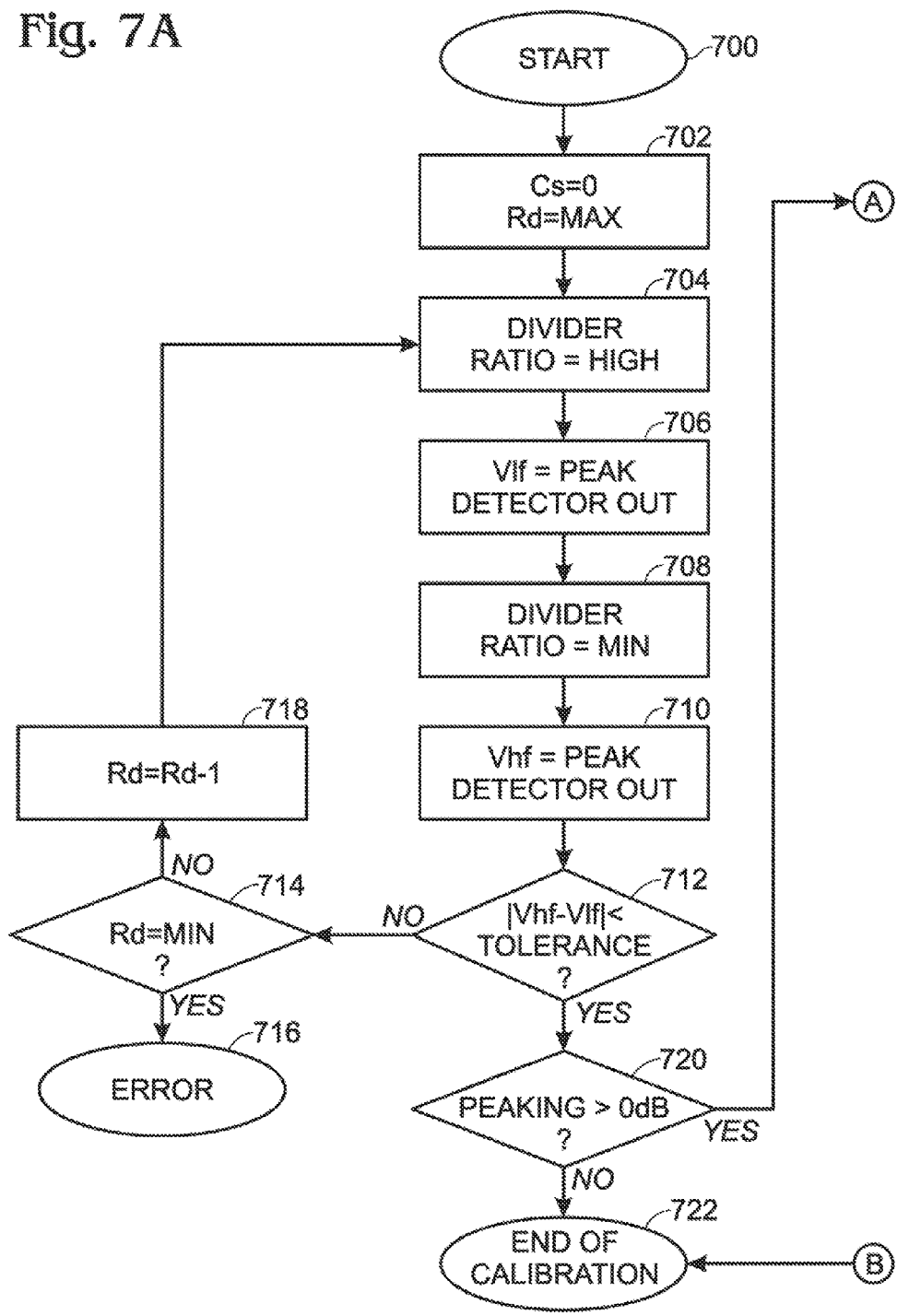

SYSTEM AND METHOD FOR PROCESS, VOLTAGE, TEMPERATURE (PVT) STABLE DIFFERENTIAL AMPLIFIER TRANSFER FUNCTION

BACKGROUND OF THE INVENTION

1. Field of the Invention

This invention generally relates to communication receivers and, more particularly, to a receiver calibration process that minimizes susceptibility to PVT variations.

2. Description of the Related Art

A typical receiver must be capable of capturing a signal with an unknown signal-to-noise ratio (SNR) and an unknown amplitude. As a result, the receiver must be capable of amplification and automatic gain control (AGC)—to set the gain to a specific amplitude. In a digital system, the receiver must also be capable of limiting—amplifying the received signal and converting it to a digital bit stream.

FIG. 1 is a schematic diagram of a conventional differential signal receiver (prior art). The first stage provides gain and improves SNR. The second stage provides frequency response conditioning. The third stage provides gain to enhance the signal amplitude.

Assuming that all transistors have the same small signal gain gm, all load resistors have the same resistance Rd (RD), and the source capacitance Cs is set to "0", the low frequency gain of the receiver can be calculated to be:

$$ADC = 2gmRd + \frac{gmRd}{1 + gmRs}$$

Based on the models provided by the transistor manufacturer for their 40 nanometer (nm) process, the variation of the process parameters (min to max over process and temperature) is: gm 30%, R (Rd and Rs): 56%. Thus, the gm*R product varies by approximately 2× over process and temperature.

In applications where a limiting function is desired, the output of the receiver feeds a slicer, which converts the signal to a rail-to-rail digital bit stream. Therefore, there is a minimum DC gain requirement. Typically, the limiting receiver is designed to have a very high gain, in order to meet the minimum gain requirement over PVT variations.

Looking at the first stage, the output load forms a pole at:

$$fp1 = \frac{1}{2\pi * RD * CL1}$$

Looking at the second stage, the RsCs degeneration forms a zero and a pole at:

$$fz2 = \frac{1}{2\pi * Rs * Cs}, \quad fp2 = \frac{1 + gm\frac{Rs}{2}}{2\pi * Rs * Cs}$$

And another pole at:

$$fp3 = \frac{1}{2\pi * RD * CL2}$$

Looking at the third stage, the output load is forms a pole at:

$$fp4 = \frac{1}{2\pi * RD * CL3}$$

CL is a combination of the gate capacitance of the nmos switch (Cgg) and the parasitic metal capacitance of the routing (Cp). Over process and temperature, Cgg can vary by 14% and Cp can vary by 50% (min to max).

Assuming that CL consists of 50% Cgg and 50% Cp, the location of the fp1, fp3, and fp4 poles can vary by up to 30%.

fz2 and fp2 are responsible for the frequency response shaping and are controlled by adjusting Cs. fz2 sets the amount of high frequency gain, while, if properly designed, fp2 is high enough not to interfere with the high frequency peaking. Its variation is not critical as long as it is placed at a very high frequency.

In summary, the variation of the poles and zero(s) of the receive filter make the frequency response unpredictable.

It would be advantageous if a receiver could be calibrated in a manner so as to make the transfer function stable, regardless of variations in process and temperature.

SUMMARY OF THE INVENTION

Accordingly, a method for process, voltage, temperature (PVT) stable transfer function calibration in a differential amplifier. The method provides a differential amplifier including a first field effect transistor (FET), a second FET, a first variable resistance gain resistor between the drain (D) of the first FET and a first dc supply voltage, and a second variable resistance gain resistor between the drain of the second FET and the first dc supply voltage. A variable resistance degeneration resistor is located between the source (S) of the first FET and the source of the second FET, a variable capacitance degeneration capacitor is located between the source of the first FET and the source of the second FET, a first current source is connected between the source of the first FET and a second dc supply voltage, and a second current source is connected between the source of the second FET and the second dc supply voltage. After disconnecting the degeneration capacitor, a differential input signal is supplied to the first and second FET gates in a first frequency band having a low frequency ($f_L$) and a high frequency ($f_H$). The first gain resistor, second gain resistor, and the degeneration resistor values are selectively adjusted until a differential output signal is measured with a flat amplitude transfer function in the first frequency band, responsive to the differential input signal and adjusted values.

After calibration, the degeneration capacitor is connected between the first and second FET sources. Then the degeneration capacitor is selectively tuned until a differential output signal with a first peaked amplitude transfer function is measured, having a first gain at $F_L$ and a second gain at $F_H$. This first peaked amplitude transfer function can be measured despite variations in PVT.

As an alternative, the degeneration capacitor is connected during calibration. Then, the first gain resistor, second gain resistor, the degeneration resistor, and the degeneration capacitor values are selectively adjusted until a differential output signal is measured, with a first peaked amplitude transfer function having a first gain at $F_L$ and a second gain at $F_H$. The first peaked amplitude transfer function remains even more stable to variations in PVT than the flat amplitude calibration method.

Additional details of the above-described methods and a clock and data recovery (CDR) device with a PVT stable receiver are described below.

BRIEF DESCRIPTION OF THE DRAWINGS

FIG. 5 is a flowchart illustrating an alternative method for PVT stable transfer function calibration in a differential amplifier.

FIGS. 7A and 7B are a flowchart illustrating the calibration method of FIG. 2 in greater detail.

DETAILED DESCRIPTION

Figure 1:
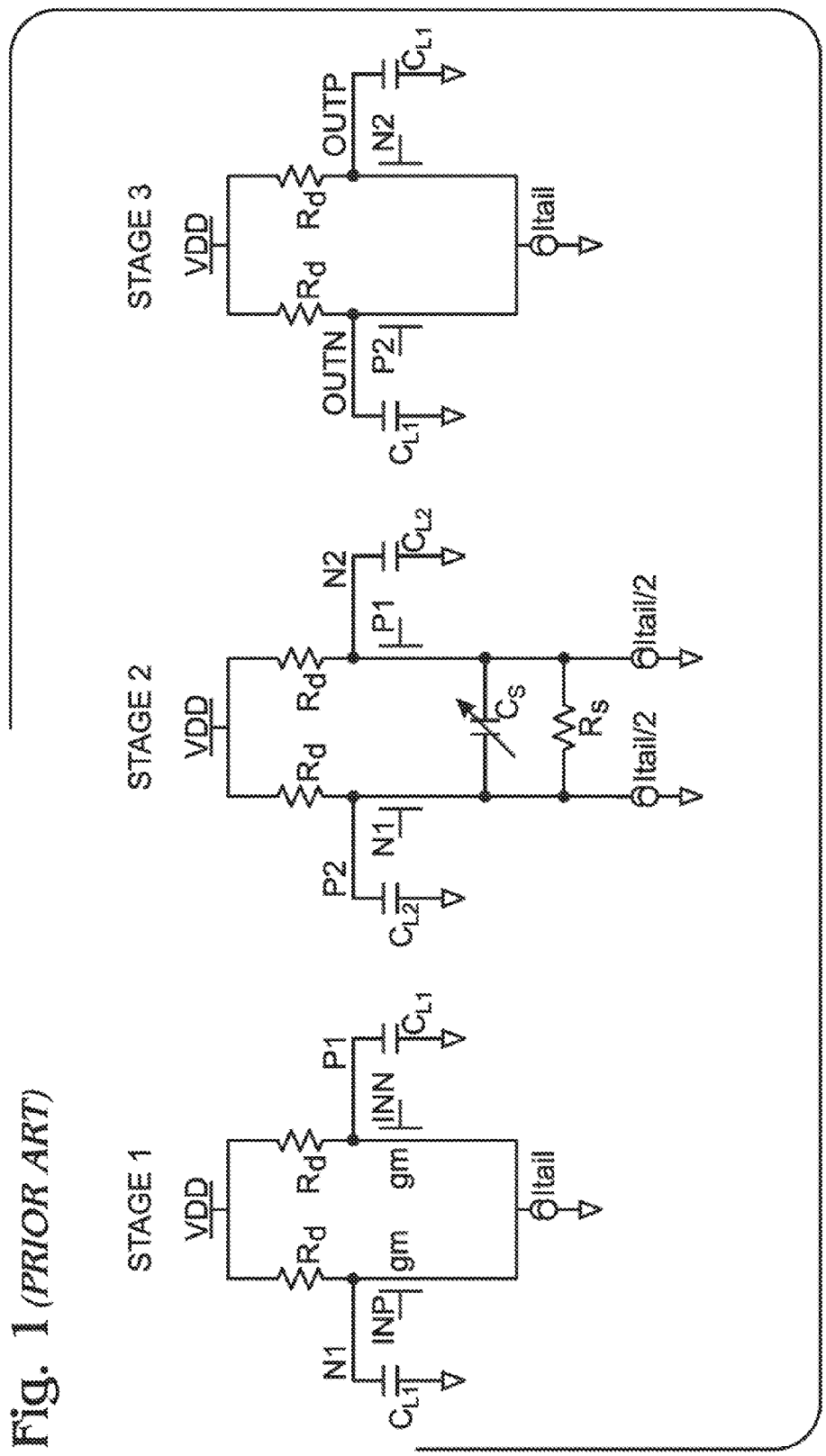
FIG. 1 is a schematic diagram of a conventional differential signal receiver (prior art).
Figure 2:
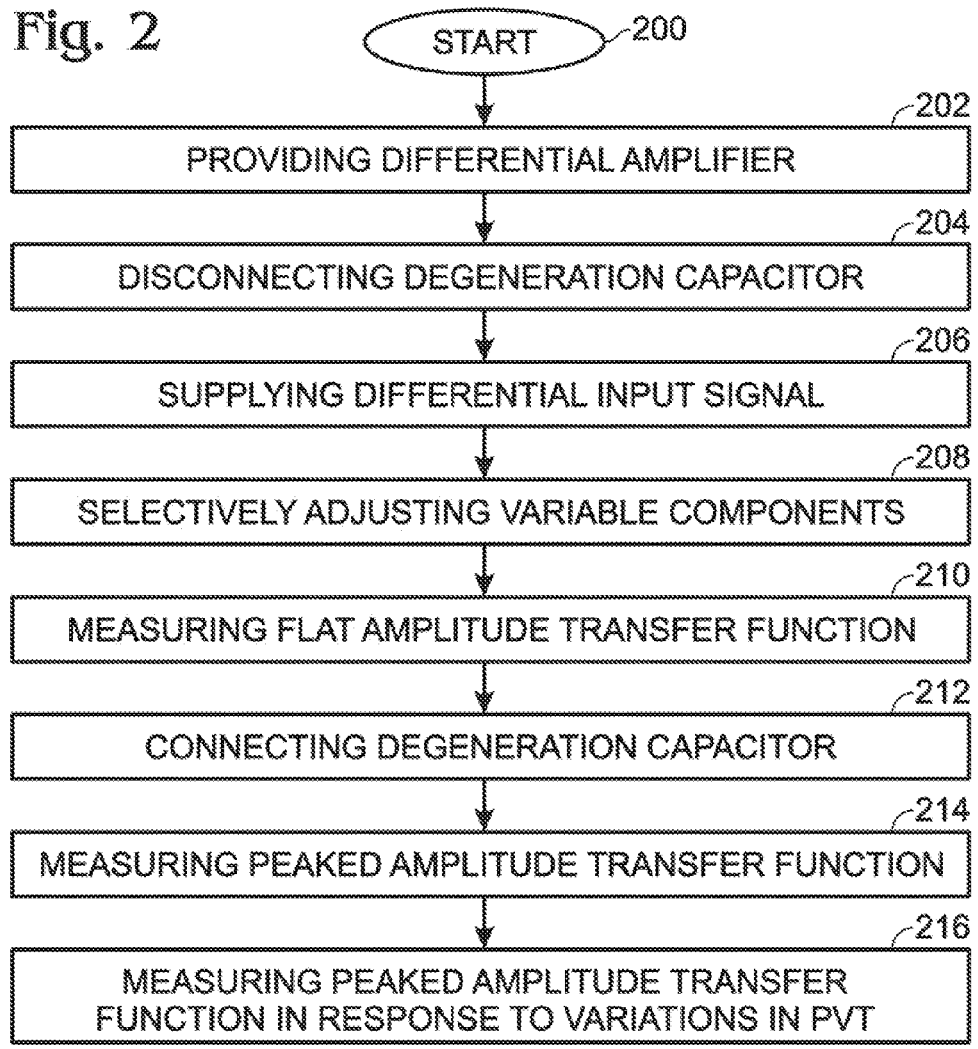
FIG. 2 is a flowchart illustrating a method for process, voltage, temperature (PVT) stable transfer function calibration of a differential amplifier.

FIG. 2 is a flowchart illustrating a method for process, voltage, temperature (PVT) stable transfer function calibration of a differential amplifier. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps.

Figure 3:
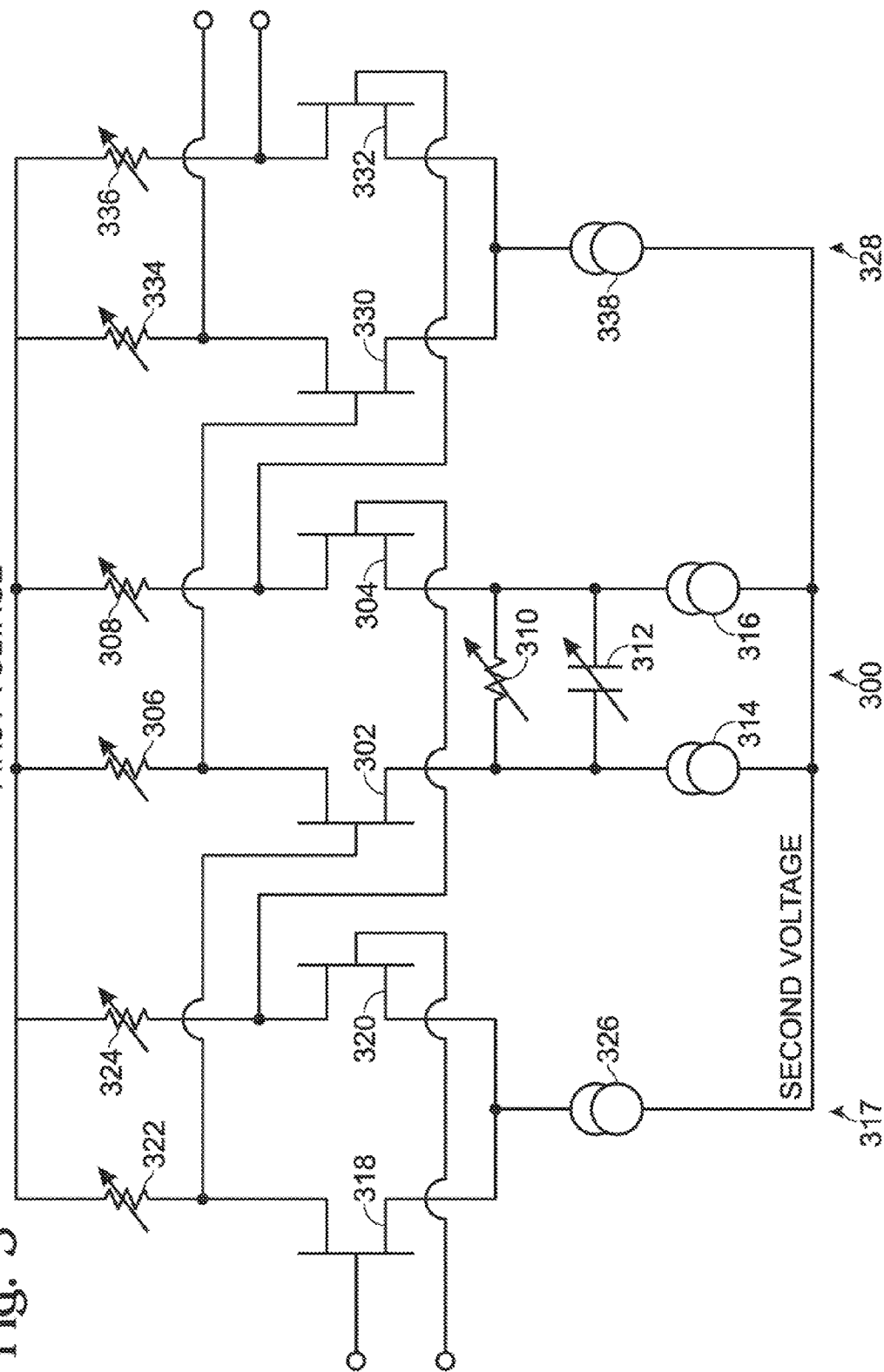
FIG. 3 is a schematic diagram of a differential amplifier chain provided in support of FIGS. 2 and 5.

FIG. 3 is a schematic diagram of a differential amplifier chain provided in support of FIGS. 2 and 5.

The method of FIG. 2 starts at Step 200. Step 202 provides a differential amplifier 300 including a first field effect transistor (FET) 302, a second FET 304, a first variable resistance gain resistor 306 between the drain (D) of the first FET and a first dc supply voltage, a second variable resistance gain resistor 308 between the drain of the second FET and the first dc supply voltage, a variable resistance degeneration resistor 310 between the source (S) of the first FET and the source of the second FET, and a variable capacitance degeneration capacitor 312 between the source of the first FET and the source of the second FET (see FIG. 3). A first current source 314 is connected between the source of the first FET and a second dc supply voltage, and a second current source 316 is connected between the source of the second FET and the second dc supply voltage.

Step 204 disconnects the degeneration capacitor (sets the capacitance value to zero). Step 206 supplies a differential input signal to the first and second FET gates in a first frequency band having a low frequency ($f_L$) and a high frequency ($f_H$). Step 208 selectively adjusts values for the first gain resistor, second gain resistor, and the degeneration resistor. In one aspect, all the gain resistors are set to the same value. Step 210 measures a differential output signal with a flat amplitude transfer function in the first frequency band, responsive to the differential input signal and adjusted values. Alternately stated, values are adjusted in Step 208 until a flat bandpass response is obtained in Step 210.

Step 212 connects the degeneration capacitor between the first and second FET sources. In response to selectively tuning the degeneration capacitor, Step 214 measures the differential output signal with a first peaked amplitude transfer function having a first gain at $F_L$ and a second gain at $F_H$. Step 216 measures the first peaked amplitude transfer function in response to variations in PVT. That is, adjustments are made to the degeneration capacitor in Step 212 until the first peaked amplitude transfer function is obtained in Step 214. Due to the calibration performed in Steps 204 to 210, the transfer function remains relatively stable (constant) despite variations in PVT.

Figure 4:
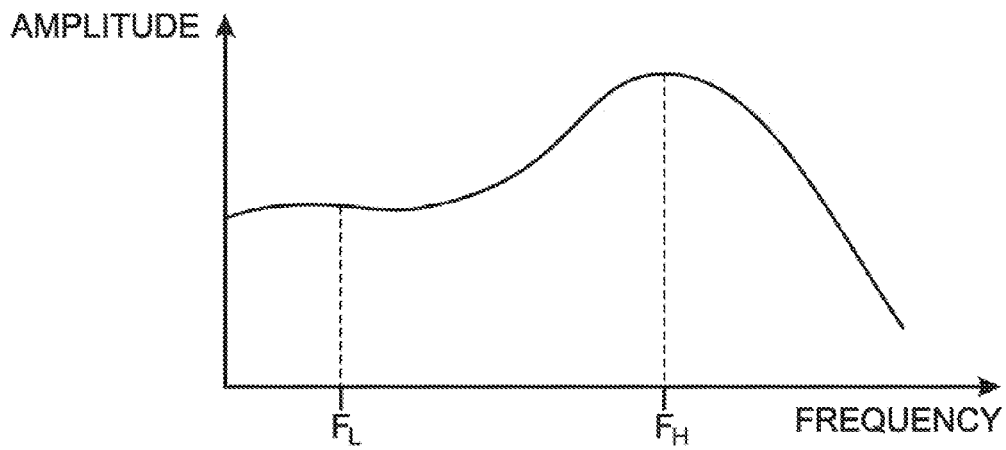
FIG. 4 is a graph depicting an exemplary peaked amplitude transfer function, where the gain at $F_H$ is greater than the gain at $F_L$.

FIG. 4 is a graph depicting an exemplary peaked amplitude transfer function, where the gain at $F_H$ is greater than the gain at $F_L$.

In another aspect, Step 202 provides a differential preamplifier 317 including a third FET 318 (see FIG. 3) with a gate to accept an input signal, a fourth FET 320 with a gate to accept a differential input signal, a third variable resistance gain resistor 322 between the drain of the third FET and the first dc supply voltage, a fourth variable resistance gain resistor 324 between the drain of the fourth FET and the first dc supply voltage, and a third current source 326 connected between the source of the third and fourth FETs and the second dc supply voltage. The gate of the first FET 302 is connected to the third FET 318 drain and the gate of the second FET 304 is connected to a drain of the fourth FET 320. Then, selectively adjusting values in Step 208 additionally includes selectively adjusting values for the third and fourth gain resistors. In one aspect, all the gain resistors are set to the same value.

In another aspect, Step 202 provides a differential post-amplifier 328 including a fifth FET 330 with a gate connected to the drain of the first FET 302, a sixth FET 332 with a gate connected to the drain of the second FET 304, a fifth variable resistance gain resistor 334 between the drain of the fifth FET 330 and the first dc supply voltage, a sixth variable resistance gain resistor 336 between the drain of the sixth FET 332 and the first dc supply voltage, and a fourth current source 338 connected between the source of the fifth and sixth FETs and the second dc supply voltage. Then, selectively adjusting values in Step 208 additionally includes selectively adjusting values for the fifth and sixth gain resistors. Alternately stated, all three amplifiers 317, 300, and 328 are connected exactly as shown in the figure. Note: the method is not limited to any particular number of amplifier stages, types of amplifier stages (frequency compensating and non-frequency compensating), or the order of amplifier stages. In one aspect, all the gain resistors are set to the same value.

In one aspect, Step 202 provides FETs all having a first small signal gain. Then, measuring the first peaked amplitude transfer function in response to PVT variations includes measuring an amplitude transfer function across the first frequency band that is constant within 1.3 decibels (dB), in the range from −40 to +130 degrees C.

FIG. 5 is a flowchart illustrating an alternative method for PVT stable transfer function calibration in a differential amplifier. The method begins at Step 500. Step 502 provides the differential amplifier 300 described above in Step 202 and shown in FIG. 3. Step 504 supplies a differential input signal to the first and second FET gates in a first frequency band having a low frequency ($f_L$) and a high frequency ($f_H$). Step 506 selectively adjusts values for the first gain resistor, second gain resistor, the degeneration resistor, and the degeneration capacitor. Step 508 measures a differential output signal, with a first peaked amplitude transfer function having a first gain at $F_L$ and a second gain at $F_H$. Alternately stated, values are adjusted in Step 506 until the first peaked amplitude response is obtained in Step 508.

In one aspect, Step 502 provides a differential preamplifier 317 as described above and shown in FIG. 3. Then, selectively adjusting values in Step 506 additionally includes selectively adjusting values for the third and fourth gain resistors. Likewise, if Step 502 provides a differential post-amplifier 328 as described above and shown in FIG. 3, selectively adjusting values in Step 506 additionally includes selectively adjusting values for the fifth and sixth gain resistors. Note: the method is not limited to any particular number of amplifier stages, types of amplifier stages (frequency compensating and non-frequency compensating), or the order of amplifier stages.

In one aspect, Step 510 measures the first peaked amplitude transfer function in response to variations in PVT. More explicitly, when Step 502 provides FETs all having a common, first, small signal gain, Step 510 measures an amplitude transfer function across the first frequency band that is constant within 0.1 decibels (dB) in response to variations in PVT, in the range from −40 to +130 degrees C.

Figure 6:
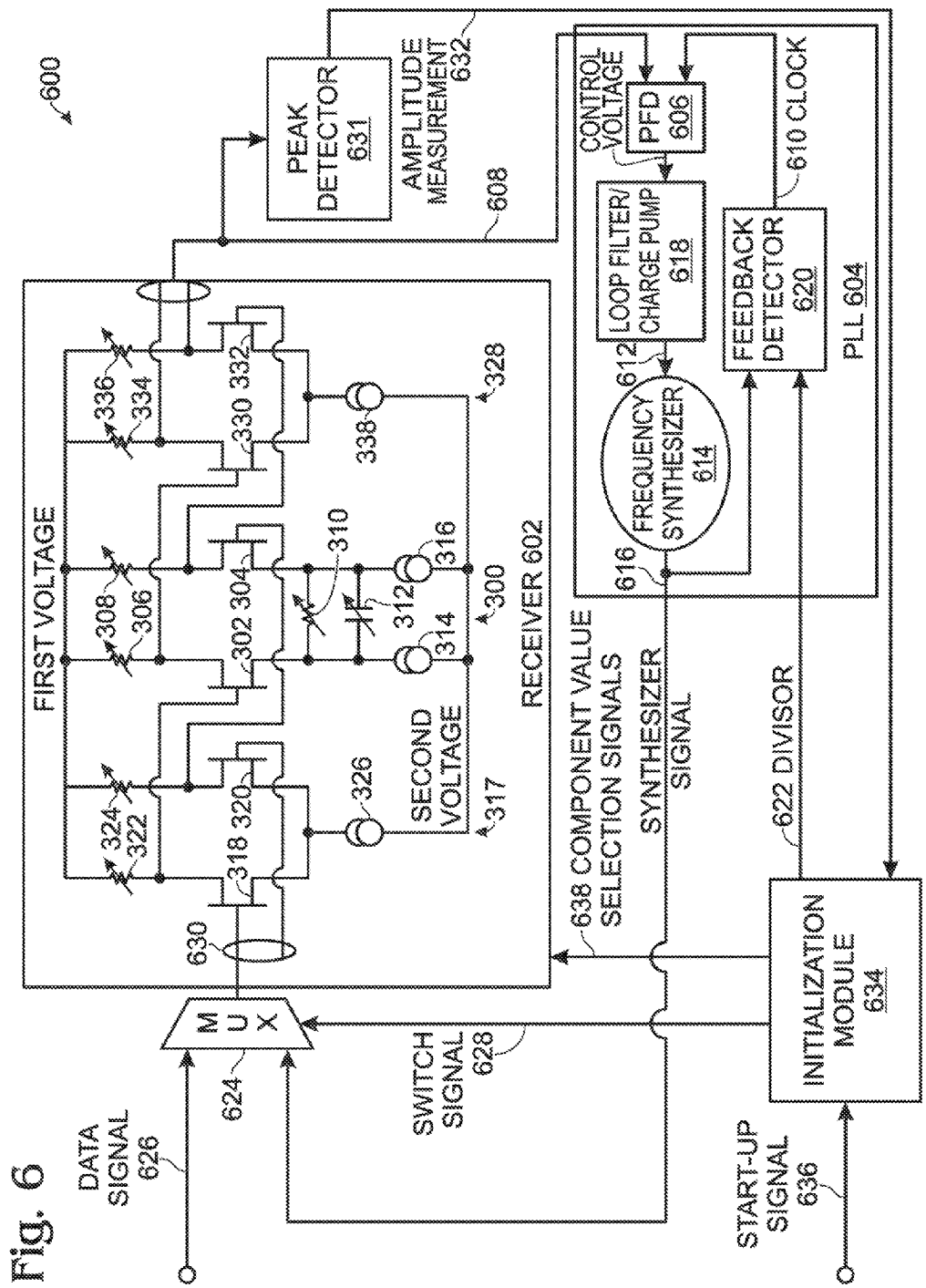
FIG. 6 is a schematic block diagram depicting a clock and data recovery (CDR) device with a PVT stable receiver.

FIG. 6 is a schematic block diagram depicting a clock and data recovery (CDR) device with a PVT stable receiver. The CDR device 600 comprises a receiver 602 including differential amplifier 300. As in FIG. 3, the differential amplifier 300 includes a first field effect transistor (FET) 302, a second FET 304, a first variable resistance gain resistor 306 between the drain (D) of the first FET and a first dc supply voltage, a second variable resistance gain resistor 308 between the drain of the second FET and the first dc supply voltage, a variable resistance degeneration resistor 310 between the source (S) of the first FET and the source of the second FET, and a variable capacitance degeneration capacitor 312 between the source of the first FET and the source of the second FET (see FIG. 3). A first current source 314 is connected between the source of the first FET and a second dc supply voltage, and a second current source 316 is connected between the source of the second FET and the second dc supply voltage.

A phase-locked loop (PLL) 604 includes a phase/frequency detector (PFD) 606 having an input on line 608 to accept a conditioned signal from the receiver 602, an input on line 610 to accept a clock signal, and an output on line 612 to supply a control voltage responsive to the difference between the data and clock signals. A frequency synthesizer 614 has an input on line 612 to accept the control voltage and an output on line 616 to supply a synthesizer signal with a frequency responsive to the control voltage. Conventionally, a loop filter or loop filter/charge pump combination 618 is used to condition the control voltage to the frequency synthesizer. A voltage controlled oscillator (VCO) is an example of a frequency synthesizer.

A feedback divider 620 has an input on line 616 to accept the synthesizer signal and an input on line 622 to accept a divisor. The feedback divider 620 divides the synthesizer signal frequency by the divisor and supplies the clock signal on line 610.

A multiplexer (MUX) 624 has an input on line 616 to accept the synthesizer signal, an input on line 626 to accept a data signal, an input on line 628 to accept a switch signal, and an output on line 630 to supply an input signal to the receiver 602 responsive to the switch signal. A peak amplitude detector 631 has an input to accept the conditioned signal from the receiver on line 608 and an output on line 632 to supply an amplitude measurement.

An initialization module 634 has an input on line 632 to accept the amplitude measurement, and input on line 636 to accept a start-up signal, an output on line 622 to supply the divisor, an output on line 628 to supply the switch signal, and outputs on line 638 to select the first gain resistor, second gain resistor, degeneration resistor, and degeneration capacitor values. In response to the start-up signal, the initialization module 634 supplies a switch signal such that the MUX 624 supplies the synthesized signal as an input to the receiver 602. The initialization module 634 disconnects the degeneration capacitor 312 and supplies divisor values to the feedback divider 620 such that the frequency synthesizer 614 supplies a synthesizer signal in a first frequency band having a low frequency ($f_L$) and a high frequency ($f_H$). The initialization module 634 selectively adjusting values for the first gain resistor 306, second gain resistor 308, and the degeneration resistor 310, using signals on line 638, such that the peak detector 631 measures a flat amplitude transfer function in the first frequency band. In one aspect, all the gain resistors are set to the same value.

The input signals to the receiver 602 on line 630, and the output signals from the receiver on line 608 are shown as a single line. In one aspect, in the interest of simplifying the drawing, the single lines 630 and 608, as well as the PLL signals, are intended to represent differential signals. Alternatively, the single lines represent single-ended signals that are converted to and from differential signals.

Although the receiver 602 is shown as being comprised of amplifiers 317, 300, and 328, it should be noted that in one aspect of the system, as described above, the MUX output on line 630 is directly connected to the gates of the differential amplifier 300 (bypassing preamplifier 317). Likewise, the output of the differential amplifier 300 is connected directly to line 608, bypassing post amplifiers 328.

After calibration, the initialization module 634 connects the degeneration capacitor 312 between the first FET 302 and second FET 304 sources and supplies a degeneration capacitor value such that the peak detector 631 measures a conditioned signal on line 608 with a first peaked transfer function having a first gain at $F_L$ and a second gain at $F_H$. The peak detector 631 measures the first peaked transfer function in response to variations in PVT.

In another aspect, the receiver includes the differential preamplifier 317. The MUX output on line 630 is connected to the third FET 318 gate and the fourth FET 320 gate. The third FET 318 drain is connected to a gate of the first FET 302 and the fourth FET 320 drain is connected to a gate of the second FET 304. In this aspect, the output of the differential amplifier 300 is connected to line 608, bypassing post-amplifiers 328. The initialization module 634 selectively adjusts the third 322 and fourth gain resistor 324 values, using signals on line 638, in response to the start-up signal on line 636. In one aspect, all the gain resistors are set to the same value.

In another aspect, the receiver 602 includes the differential post-amplifier 328, so that the gates of FETs 302 and 304 are connected to line 630. The drain of the fifth FET 330 supplies a conditioned signal and the drain of the sixth FET 332 supplies a differential conditioned signal on line 608. The initialization module 634 has an output on line 638 to selectively adjust the fifth and sixth gain resistor values in response to the start-up signal. In one aspect, all the gain resistors are set to the same value.

In another aspect, the receiver includes all three amplifiers 317, 300, and 328 connected as exactly as shown. Note: the method is not limited to any particular number of amplifier stages, types of amplifier stages (frequency compensating and non-frequency compensating), or the order of amplifier stages. If all the FETs have the same small signal gain, the peak detector 631 is able to measure a first peaked amplitude transfer function across the first frequency band that is constant within 1.3 decibels (dB) in response to variations in PVT.

In another variation, an initialization module 634 initially selects the first gain resistor 306, second gain resistor 308, degeneration resistor 310, and degeneration capacitor 312 values in response to the start-up signal (the degeneration capacitor is not disconnected in this variation). The initialization module selectively adjusts values for the first gain resistor, second gain resistor, degeneration capacitor, and the degeneration resistor such that the peak detector 631 measures a first peaked amplitude transfer function having a first gain at $F_L$ and a second gain at $F_H$, which remains constant despite variations in PVT.

As in the example above, the receiver may include the combination of the pre-amplifier 317 and the differential amplifier 300, and the initialization module 634 additionally adjusts third gain resistor 322 and fourth gain resistor 324 values in response to the start-up signal. Also, as in the example above, the receiver 602 may include a differential post-amplifier, with the gates of the first FET 302 and second FET 304 connected to line 630. The fifth FET 330 has a gate connected to the first FET drain and the sixth FET 332 has a gate connected to the second FET drain. The drain of the fifth FET 330 supplies a conditioned signal on line 608 and the drain of the sixth FET 332 supplies a differential conditioned signal. The initialization module 634 additionally adjusts the fifth gain resistor 334 and the sixth gain resistor 336 values in response to the start-up signal.

In another aspect, the receiver includes all three amplifiers 317, 300, and 328 connected as exactly as shown. Note: the method is not limited to any particular number of amplifier stages, types of amplifier stages (frequency compensating and non-frequency compensating), or the order of amplifier stages. Considering a receiver where amplifiers 300, 317, and 328 are used, and if all the FETs have the same small signal gain, first peaked amplitude transfer function across the first frequency band is constant within 0.1 decibels (dB), despite variations in PVT.

Functional Description

One approach to deal with the PT variation is to calibrate gain resistors so as to present a fixed resistance value response. Fixed resistance means that the resistors are calibrated to have an arbitrary nominal value (for example, 1K ohms for load resistors and 500 ohms for the degeneration resistor). The resistor calibration compensates for process variation of the resistor value by comparing its nominal resistance value with an external, accurate resistor. That method does not require any wideband measurement and is done at DC. By doing that, the gm*R variation drops to 30% and RC variation drops to 32%. However, in some high performance applications, this might not be sufficient in order to maintain good performance at extreme PT conditions.

Another approach is to directly measure the transfer function of the receiver and calibrate it to achieve a specific (e.g., peaked) response.

Figure 7B:
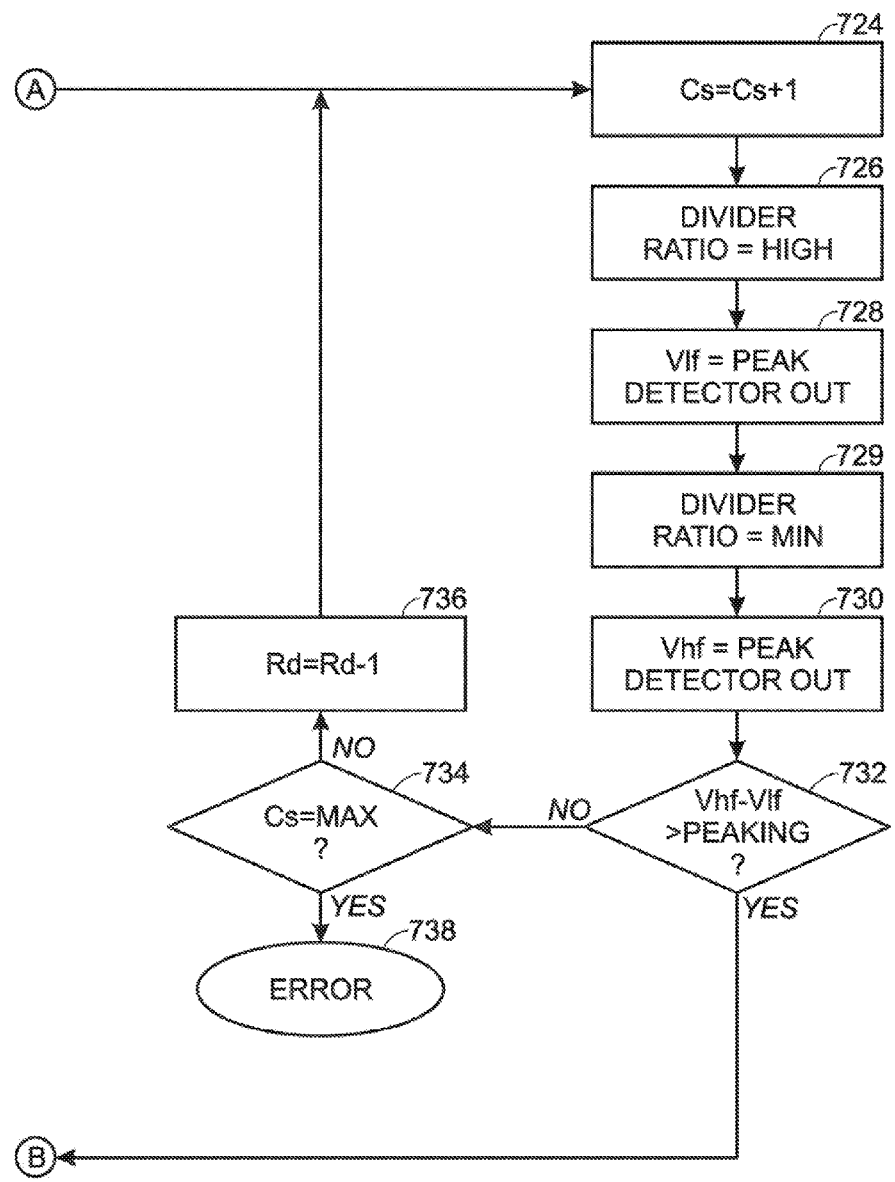

FIGS. 7A and 7B are a flowchart illustrating the calibration method of FIG. 2 in greater detail. The method starts at Step 700. In Step 702 the switch signal supplies the synthesizer signal to the receiver from the MUX (see FIG. 6). The gain resistors are set to a maximum value and the degeneration capacitor is set to zero. In Step 704 the divisor is selected to supply frequency Fri, and in Step 706 the amplitude is measured. In Step 708 the divisor is selected to supply frequency $F_L$, and in Step 710 the amplitude is measured. Amplitude flatness tolerance is measured in Step 712. If the amplitude measurements are out of tolerance, Step 714 determines if the gain resistors are set to a minimum value. If so, an error is asserted in Step 716. If not, the gain resistor values are decremented in Step 718 and the method returns to Step 704.

If the amplitude flatness is in tolerance, Step 720 determines if a peaked amplitude is required. If not, the process ends at Step 722. If peaking is required, Step 724 increments the degeneration capacitor value. In Step 726 the divisor is selected to supply frequency $F_H$, and in Step 728 the amplitude is measured. In Step 730 the divisor is selected to supply frequency $F_L$, and in Step 732 the amplitude is measured. If Step 732 determines that the peaking is sufficient, the process ends. Otherwise, Step 734 determines if the degeneration capacitor value is at the maximum limit. If so, an error is asserted in Step 738. Otherwise, Step 736 decrements the gain resistor values, and process returns to Step 724.

Note: for AGC applications, gain can be controlled by adjusting Rs (resistor 310). Rs is adjusted after the first stage of calibration.

A receiver can consist of any number of gain stages, and any number of frequency response shaping circuits. Also, degeneration resistors (Rs) can be added to the gain stages (pre and post-amplifiers) to provide more gain control for AGC applications. The algorithm can be used to calibrate other types of receivers or filters, and not limited to the example shown in this document. The algorithm can also measure the entire transfer function of a receiver, by injecting a range of frequencies to the input and measure the output response.

For a fast calibration, the calibration algorithm can be reduced to the first stage only, meaning that only the flat response is calibrated. To the first order, the algorithm fixes the RC time constant. In that case, Rs (degeneration resistor) should also be calibrated together with Rd (gain resistors). The AGC control, if needed, is performed on a non-peaking stage as shown in the example below.

Figure 8:
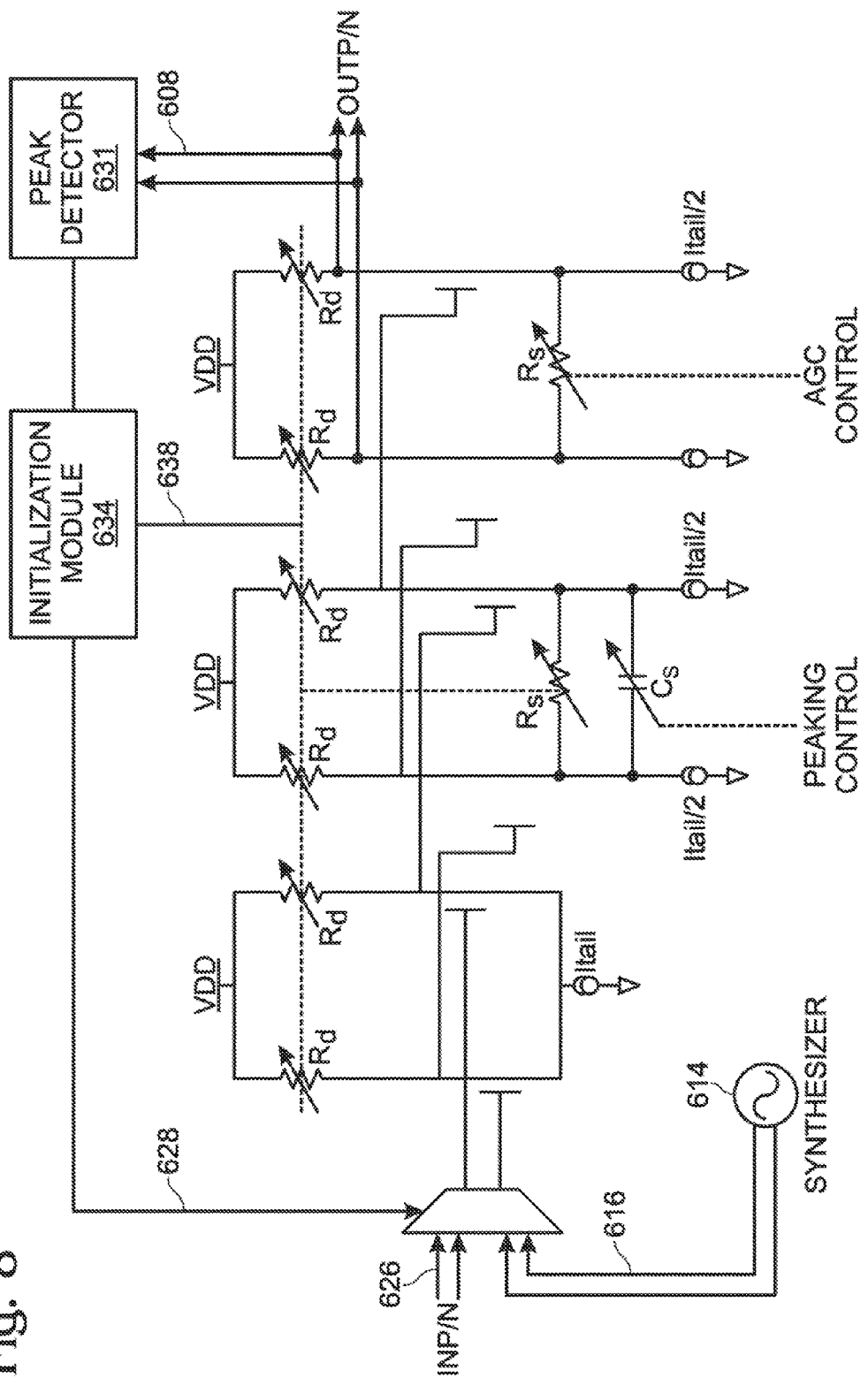
FIG. 8 is a schematic diagram depicting the addition of a degeneration resistor to a non-peaking gain stage, for the purpose of AGC control.

FIG. 8 is a schematic diagram depicting the addition of a degeneration resistor to a non-peaking gain stage, for the purpose of AGC control.

A simulation was performed on the circuit of FIG. 3 using all three amplifier stages. The amplitude response was designed to peak at 5 gigahertz (GHz). The gain resistors were set to provide −1 dB attenuation at 5 GHz, with degeneration capacitor 312 (Cs)=0. The simulation results are shown in Table 1, where "cold" is −40 and "hot" is +130 degrees C.

TABLE 1

| Corner | | Min peaking (dB) | Max peaking (dB) | Max Peaking variation (dB) |
| --- | --- | --- | --- | --- |
| No calibration | Slow, cold | −1.82 | 8.9 | 2.7 |
| | Fast, hot | −0.48 | 6.2 | |
| Fixed R calibration | Slow, cold | −1.34 | 8.4 | 1.3 |
| | Fast, hot | −0.72 | 7.1 | |
| Time constant calibration | Slow, cold | −1 | 7.75 | 0.13 |
| | Fast, hot | −1 | 7.88 | |

A CDR device with a stable receiver and a corresponding receiver calibration process have been provided. Examples of structures and process flows have been presented to illustrate the invention. However, the invention is not limited to merely these examples. Other variations and embodiments of the invention will occur to those skilled in the art.

We claim:

1. In a differential amplifier, a method for process, voltage, temperature (PVT) stable transfer function calibration, the method comprising:

providing a differential amplifier including a first field effect transistor (FET), a second FET, a first variable resistance gain resistor between the drain (D) of the first FET and a first dc supply voltage, a second variable resistance gain resistor between the drain of the second FET and the first dc supply voltage, a variable resistance degeneration resistor between the source (S) of the first FET and the source of the second FET, a variable capacitance degeneration capacitor between the source of the first FET and the source of the second FET, a first current source connected between the source of the first FET and a second dc supply voltage, and a second current source connected between the source of the second FET and the second dc supply voltage;

disconnecting the degeneration capacitor;

supplying a differential input signal to the first and second FET gates in a first frequency band having a low frequency ($f_L$) and a high frequency ($f_H$);

selectively adjusting values for the first gain resistor, second gain resistor, and the degeneration resistor; and, measuring a differential output signal with a flat amplitude transfer function in the first frequency band, responsive to the differential input signal and adjusted values.

2. The method of claim 1 further comprising;

connecting the degeneration capacitor between the first and second FET sources;

in response to selectively tuning the degeneration capacitor, measuring the differential output signal with a first peaked amplitude transfer function having a first gain at $F_L$ and a second gain at $F_H$;

measuring the first peaked amplitude transfer function in response to variations in PVT.

3. The method of claim 1 further comprising:

providing a differential preamplifier including a third FET with a gate to accept an input signal, a fourth FET with a gate to accept a differential input signal, a third variable resistance gain resistor between the drain of the third FET and the first dc supply voltage, a fourth variable resistance gain resistor between the drain of the fourth FET and the first dc supply voltage, and a third current source connected between the source of the third and fourth FETs and the second dc supply voltage;

wherein providing the differential amplifier includes connecting the gate of the first FET to the third FET drain and the gate of the second FET to a drain of the fourth FET; and, wherein selectively adjusting values additionally includes selectively adjusting values for the third and fourth gain resistors.

4. The method of claim 3 further comprising:

providing a differential post-amplifier including a fifth FET with a gate connected to the drain of the first FET, a sixth FET with a gate connected to the drain of the second FET, a fifth variable resistance gain resistor between the drain of the fifth FET and the first dc supply voltage, a sixth variable resistance gain resistor between the drain of the sixth FET and the first dc supply voltage, and a fourth current source connected between the source of the fifth and sixth FETs and the second dc supply voltage; and, wherein selectively adjusting values additionally includes selectively adjusting values for the fifth and sixth gain resistors.

5. The method of claim 4 wherein providing the differential amplifier includes providing FETs all having a first small signal gain; and, wherein measuring the first peaked amplitude transfer function includes measuring an amplitude transfer function across the first frequency band that is constant within 1.3 decibels (dB) in response to variations in PVT.

6. In a differential amplifier, a method for process, voltage, temperature (PVT) stable transfer function calibration, the method comprising:

providing a differential amplifier including a first field effect transistor (FET), a second FET, a first variable resistance gain resistor between the drain (D) of the first FET and a first dc supply voltage, a second variable resistance gain resistor between the drain of the second FET and the first dc supply voltage, a variable resistance degeneration resistor between the source (S) of the first FET and the source of the second FET, a variable capacitance degeneration capacitor between the source of the first FET and the source of the second FET, a first current source connected between the source of the first FET and a second dc supply voltage, and a second current source connected between the source of the second FET and the second dc supply voltage;

supplying a differential input signal to the first and second FET gates in a first frequency band having a low frequency ($f_L$) and a high frequency ($f_H$);

selectively adjusting values for the first gain resistor, second gain resistor, the degeneration resistor, and the degeneration capacitor; and, measuring a differential output signal, with a first peaked amplitude transfer function having a first gain at $F_L$ and a second gain at $F_H$, wherein measuring the first peaked amplitude transfer function comprises measuring an amplitude transfer function across the first frequency band that is constant within 0.1 decibels (dB) in response to variations in PVT.

7. The method of claim 6 further comprising:

measuring the first peaked amplitude transfer function in response to variations in PVT.

8. The method of claim 6 further comprising:

providing a differential preamplifier including a third FET having a gate to accept an input signal, a fourth FET with a gate to accept a differential input signal, a third variable resistance gain resistor between the drain of the third FET and the first dc supply voltage, a fourth variable resistance gain resistor between the drain of the fourth FET and the first dc supply voltage, and a third current source connected between the source of the third and fourth FETs and the second dc supply voltage;

wherein providing the differential amplifier includes connecting the gate of the first FET to the third FET drain and the gate of the second FET to a drain of the fourth FET; and, wherein selectively adjusting values additionally includes selectively adjusting values for the third and fourth gain resistors.

9. The method of claim 8 further comprising:

providing a differential post-amplifier including a fifth FET with a gate connected to the drain of the first FET, a sixth FET with a gate connected to the drain of the second FET, a fifth variable resistance gain resistor between the drain of the fifth FET and the first dc supply voltage, a sixth variable resistance gain resistor between the drain of the sixth FET and the first dc supply voltage, and a fourth current source connected between the source of the fifth and sixth FETs and the second dc supply voltage; and, wherein selectively adjusting values additionally includes selectively adjusting values for the fifth and sixth gain resistors.

10. The method of claim 9 wherein providing the differential amplifier includes providing FETs all having a first small signal gain; and, wherein measuring the first peaked amplitude transfer function includes measuring an amplitude transfer function across the first frequency band that is constant within 0.1 decibels (dB) in response to variations in PVT.

11. In a differential amplifier, a method for process, voltage, temperature (PVT) stable transfer function calibration, amplifier comprising:
- a differential amplifier including a first field effect transistor (FET), a second FET, a first variable resistance gain resistor between the drain (D) of the first FET and a first dc supply voltage, a second variable resistance gain resistor between the drain of the second FET and the first dc supply voltage, a variable resistance degeneration resistor between the source (S) of the first FET and the source of the second FET, a variable capacitance degeneration capacitor between the source of the first FET and the source of the second FET, a first current source connected between the source of the first FET and a second dc supply voltage, and a second current source connected between the source of the second FET and the second dc supply voltage;
- a means for disconnecting the degeneration capacitor;
- a means for supplying a differential input signal to the first and second FET gates in a first frequency band having a low frequency ($f_L$) and a high frequency ($f_H$);
- a means for selectively adjusting values for the first gain resistor, second gain resistor, and the degeneration resistor; and,
- a means for measuring a differential output signal with a flat amplitude transfer function in the first frequency band, responsive to the differential input signal and adjusted values;
- a means for connecting the degeneration capacitor between the first and second FET sources; and,
- in response to selectively tuning the degeneration capacitor, a means for measuring the differential output signal with a first peaked amplitude transfer function having a first gain at $F_L$ and a second gain at $F_H$.

12. The amplifier of claim 11 further comprising a means for measuring the first peaked amplitude transfer function in response to variations in PVT.

13. The amplifier of claim 11 further comprising:
- a differential preamplifier comprising a third FET with a gate to accept an input signal, a fourth FET with a gate to accept a differential input signal, a third variable resistance gain resistor between the drain of the third FET and the first dc supply voltage, a fourth variable resistance gain resistor between the drain of the fourth FET and the first dc supply voltage, and a third current source connected between the source of the third and fourth FETs and the second dc supply voltage;
- wherein the first FET gate is connected to the third FET drain and the second FET gate is connected to the fourth FET drain; and
- wherein the means for selectively adjusting values additionally comprises a means for selectively adjusting values for the third and fourth gain resistors.

14. The amplifier of claim 13 further comprising:
- a differential post-amplifier comprising a fifth FET with a gate connected to the drain of the first FET, a sixth FET with a gate connected to the drain of the second FET, a fifth variable resistance gain resistor between the drain of the fifth FET and the first dc supply voltage, a sixth variable resistance gain resistor between the drain of the sixth FET and the first dc supply voltage, and a fourth current source connected between the source of the fifth and sixth FETs and the second dc supply voltage; and
- wherein the means for selectively adjusting values additionally comprises a means for selectively adjusting values for the fifth and sixth gain resistors.

15. The amplifier of claim 14, wherein all the FETs comprise a first small signal gain; and wherein the means for measuring the first peaked amplitude transfer function comprises a means for measuring an amplitude transfer function across the first frequency band that is constant within 1.3 decibels (dB) in response to variations in PVT.

* * * * *